(12) United States Patent
Lawlyes

(10) Patent No.: US 7,294,007 B1
(45) Date of Patent: Nov. 13, 2007

(54) ELECTRONICS ENCLOSURE AND METHOD OF FABRICATING AN ELECTRONICS ENCLOSURE

(75) Inventor: Daniel A. Lawlyes, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 11/533,494

(22) Filed: Sep. 20, 2006

(51) Int. Cl.
H01R 13/52 (2006.01)
(52) U.S. Cl. ........................ 439/276; 439/936
(58) Field of Classification Search ............ 439/276, 439/519, 936; 174/17 LF, 17 R, 50, 59
See application file for complete search history.

(56) References Cited

U.S. PATENT DOCUMENTS

| | | | | |
|---|---|---|---|---|
| 5,703,754 A | * | 12/1997 | Hinze | 361/736 |
| 5,895,883 A | * | 4/1999 | Bhatti et al. | 174/17 LF |
| 6,729,889 B2 | * | 5/2004 | Bauer | 439/67 |
| 6,900,383 B2 | * | 5/2005 | Babb et al. | 174/394 |
| 6,964,575 B1 | * | 11/2005 | Sailor | 439/76.1 |
| 7,048,564 B1 | * | 5/2006 | Hinze | 439/276 |

\* cited by examiner

Primary Examiner—James R. Harvey
(74) Attorney, Agent, or Firm—Jimmy L. Funke

(57) ABSTRACT

A device for enclosing electronics and providing an electrical connection to the enclosed electronics is provided. The device includes a housing having alignment and barrier features, and a circuit board having alignment features and plated through-holes. The circuit board is coupled to the housing such that the alignment features of the circuit board and housing are aligned, and such that the barrier features of the housing are located adjacent the plated through-holes. The device further includes an epoxy material that at least partially coats the surfaces of the housing and circuit board. The barrier features separate the plated through-holes from the epoxy material, such that the epoxy material is not in contact with the interior surface of the plated through-holes. A method for enclosing electronics and providing an electrical connection to the enclosed electronics is also provided.

8 Claims, 4 Drawing Sheets

ELECTRONICS ENCLOSURE AND METHOD OF FABRICATING AN ELECTRONICS ENCLOSURE

TECHNICAL FIELD

The present invention relates generally to electronics enclosures and connectors, and more specifically, to low-profile electronics enclosures with integrated electronics circuit boards, circuit board connectors and housings.

BACKGROUND OF THE INVENTION

Trucks, boats, automobiles, and other vehicles are commonly equipped with various electronic modules and devices to perform functions related to the operation of the vehicle and/or services for vehicle occupants. Examples of electronics modules typically employed to assist in the control and/or operation of the vehicle include transmission control modules for controlling the operation of a vehicle transmission, engine control modules for controlling the operation of the vehicle engine, anti-lock brake system (ABS) modules for providing ABS braking capability, suspension control modules for regulating the operation of the vehicle suspension system, airbag modules for regulating the deployment of vehicle airbags in the event of an accident, and stability control system modules for providing improved vehicle handling in potentially unstable driving situations. Examples of electronics modules typically employed in a vehicle to provide vehicle occupants with services include vehicle audio modules for providing analog and/or digital radio services and CD audio services to vehicle occupants, global positioning system (GPS) modules for providing vehicle location information to vehicle occupants, emergency services modules, such as, for example, OnStar®, for providing vehicle occupants with concierge and/or safety related services, satellite modules for transmitting and/or receiving audio and/or data to and from the vehicle, cellular phone modules for providing a cellular communication link to occupants of the vehicle, and wireless transmit and/or receive modules for providing vehicle occupants with a wireless interface between portable electronics devices and electronics devices located in the vehicle.

Conventional vehicle electronics modules and/or devices described above generally may be located in an electronics enclosure to protect the electronics devices. Electronics components that make up the electronics modules and/or devices are typically attached to printed circuit boards that provide electrical connections to other electronics components attached to the printed circuit boards, and that serve to support the various electronics components. When enclosed in an electronics enclosure, typical vehicle electronics modules or devices are connected to devices external to the electronics enclosure by means of connectors configured to carry electrical signals between the external devices and the vehicle electronics modules and/or devices located in the electronics enclosures. These connectors typically take the form of ribbon cables connected to the printed circuit boards located inside the electronics enclosure, or multi-pin shrouded connectors connected to the printed circuit boards located inside the electronics enclosure.

Although ribbon cables can provide a means for providing signals to and from the electronics enclosed in the electronics enclosure, the use of ribbon cables can require the size of the electronics enclosure to be increased due to the need for the ribbon cable to extend beyond the edges of the electronics enclosure. Although shrouded multi-pin connectors can provide a means for providing signals to and from the electronics enclosed in the electronics enclosure, the use of a shrouded multi-pin connector can require the thickness of the electronics enclosure to be increased so that the shroud of the connector can be securely attached to the electronics enclosure. In addition, pins for shrouded connectors and ground connections in typical electronics enclosures are generally soldered, using solder interconnects, to printed circuit boards located inside the enclosures, requiring both additional space for the solder connections, and additional processing steps to apply the solder. The typical products required for solder interconnect connections include solder alloy, interconnect pins, and a printed circuit board with corresponding printed circuit board holes. The space required for solder interconnects can be large, depending on the number of input and output signal connectors, and may not be practical when space is limited. Solder interconnect processing typically requires space limitations, referred to as keep-out zones, with respect to component placement on the printed circuit board. Solder interconnect processing may also require additional materials, such as pallets, to facilitate the process, and may also require special component placement equipment.

Due to the typically limited amount of space available for various vehicle electronics modules, it is generally desirable to provide for electronics enclosures that are as small as possible and relatively impervious to external harmful environmental factors, while providing for reliable electrical connections to devices external to the electronics enclosure. This can be especially true for transmission control modules, in which the electronics housing and associated connections are typically required to fit into a very small space, tolerate vibration, withstand transmission temperatures greater than 140 degrees centigrade, and be surrounded by transmission fluid while remaining sealed such that the transmission fluid does not enter the electronics enclosure.

What is needed is a reliable, low-profile, reduced size vehicle electronics enclosure that provides reliable connections to external devices while withstanding high temperatures and vibration.

SUMMARY OF THE INVENTION

In accordance with one aspect of the present invention, a device for enclosing electronics and providing an electrical connection to the enclosed electronics is provided. The device includes a housing having alignment and barrier features, and a circuit board having alignment features and plated through-holes. The circuit board is coupled to the housing such that the alignment features of the circuit board and housing are aligned, and such that the barrier features of the housing are located adjacent the plated through-holes. The device further includes an epoxy material that at least partially coats the surfaces of the housing and circuit board. The barrier features separate the plated through-holes from the epoxy material, such that the epoxy material is not in contact with the interior surface of the plated through-holes.

In accordance with another aspect of the present invention, a method for enclosing electronics and providing an electrical connection to the enclosed electronics is provided. The method includes the steps of providing a housing having alignment and barrier features, and providing a circuit board having alignment features and plated through-holes. The method further includes the step of positioning the circuit board adjacent to the housing so that the alignment features of the circuit board and housing align, and so that the barrier features surround the plated through-holes on at least one side of the circuit board. The method further includes the step of positioning the housing and circuit board in tooling having cover features such that the housing substantially surrounds the housing and circuit board. The method still further includes the step of applying an epoxy to the housing and circuit board, such that the cover and barrier features prevent the epoxy from entering the plated through-holes.

In accordance with yet another aspect of the present invention, a method for enclosing electronics and providing an electrical connection to the enclosed electronics is provided. The method includes the steps of providing a housing having alignment and barrier features, and providing a circuit board having alignment features and plated through-holes. The method further includes the step of positioning the circuit board adjacent to the housing so that the alignment features of the circuit board and housing align, and so that the barrier features surround the plated through-holes on at least one side of the circuit board. The method further includes the step of positioning the housing and circuit board in tooling having cover features such that the housing substantially surrounds the housing and circuit board. The method still further includes the step of applying an epoxy to the housing and circuit board, such that the cover and barrier features prevent the epoxy from entering the plated through-holes. The method also includes the steps of removing the tooling to expose the epoxy, housing, and through-holes, and inserting pins of a leadframe assembly into exposed plated through-holes such that the pins are in electrical contact with the plated through-holes.

These and other features, advantages and objects of the present invention will be further understood and appreciated by those skilled in the art by reference to the following specification, claims and appended drawings.

BRIEF DESCRIPTION OF THE DRAWINGS

The present invention will now be described, by way of example, with reference to the accompanying drawings, in which.

DESCRIPTION OF THE PREFERRED EMBODIMENTS

Figure 1:
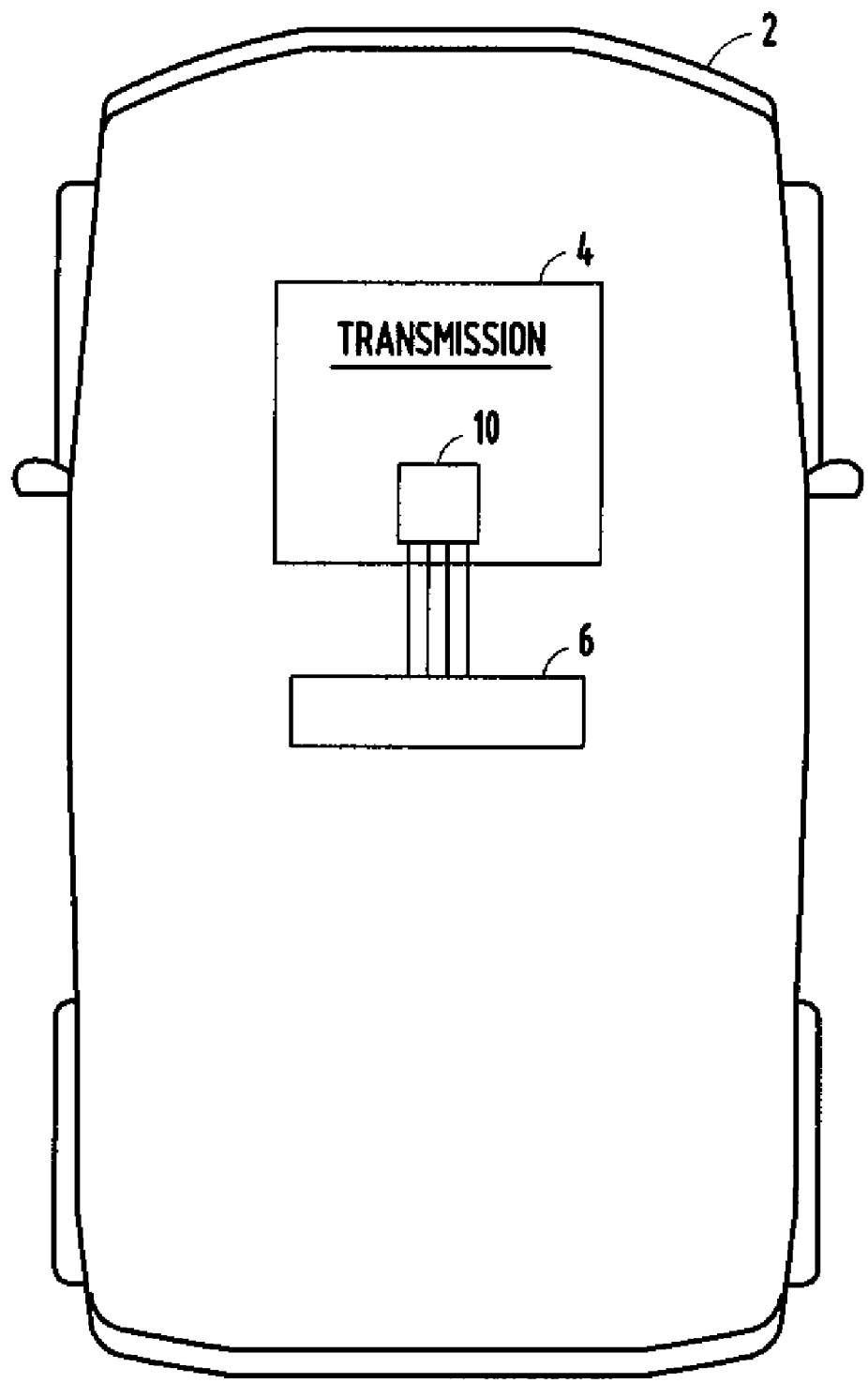
FIG. 1 is a schematic diagram generally illustrating a vehicle including an electronics enclosure, according to one embodiment of the present invention.

Referring to FIG. 1, a vehicle 2 is generally shown including a transmission 4 for controlling the speed and direction of travel of a vehicle 2. As shown, transmission 4 includes an electronics enclosure 10 coupled to an electronic device 6 located external to vehicle transmission 4. In the embodiment shown, electronics enclosure 10 is located within transmission 4. In an alternate embodiment, electronics enclosure 10 may be attached to transmission 4. Electronics enclosure 10 is electrically coupled to electronic device 6, such that electronic signals may be provided from electronic device 6 to electronics located within electronics enclosure 10, and such that electronic signals provided by electronic circuitry within electronics enclosure 10 may be provided to electronic device 6.

Figure 2:
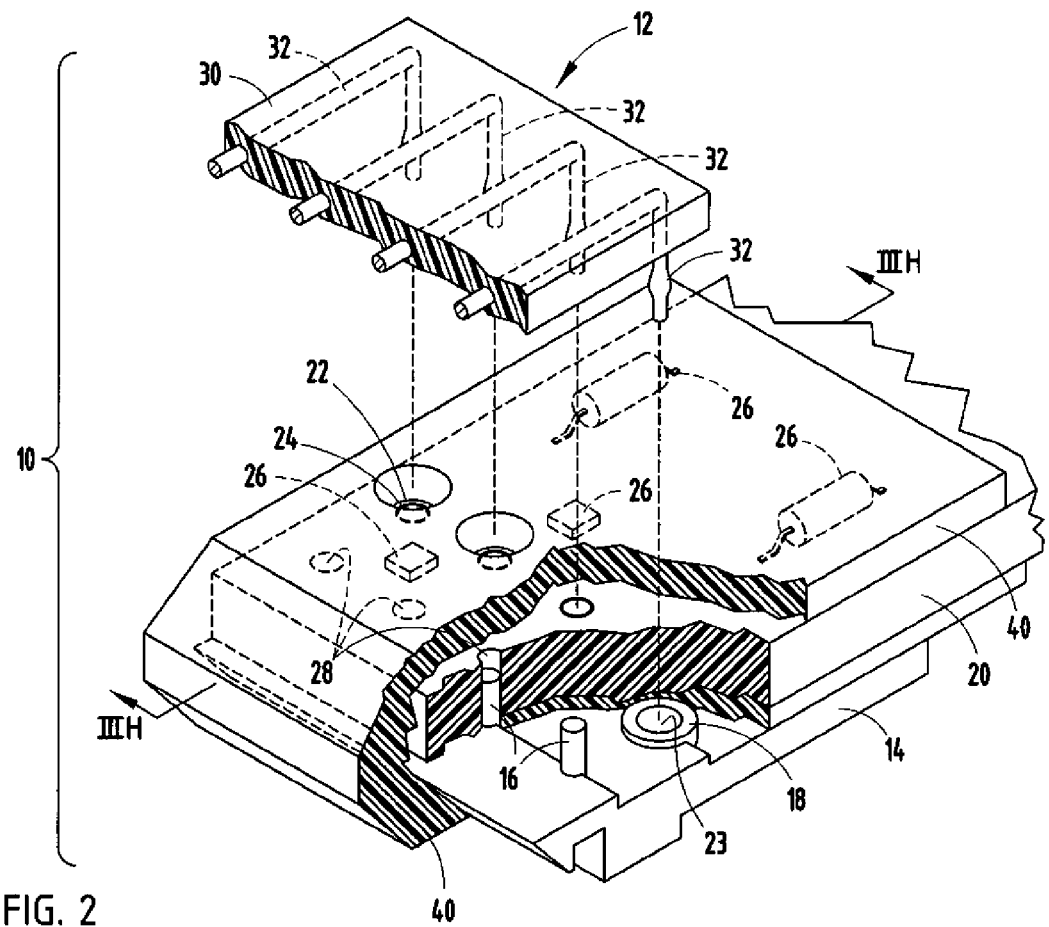
FIG. 2 is an exploded, partial cut away, perspective view generally illustrating an electronics enclosure, according to one embodiment of the present invention.

Referring to FIG. 2, the electronics enclosure 10 is shown, according to one embodiment of the present invention. As shown, electronics enclosure 10 includes a housing 14. In one embodiment of the present invention, housing 14 is a die cast aluminum housing configured to act as a heatsink for devices located adjacent to housing 14. As shown, housing 14 includes housing alignment features 16 and barrier features 18. In the present embodiment, housing alignment features 16 are posts extending upwardly from the upper surface of housing 14. As shown, housing alignment features 16 are spaced along the upper surface of housing 14. Housing alignment features 16 are configured, such that additional structures may be positioned relative to housing 14 by aligning alignment features of the additional structures with the housing alignment features 16. It should be appreciated that in alternate embodiments, housing alignment features 16 may have different shapes, sizes, and locations. Housing 14 is also shown including barrier features 18. As shown, barrier features 18 have a cylindrical shape and extend upward from the upper surface of housing 14. In the present embodiment, barrier features 18 include inner cavities formed by the walls of barrier features 18.

Electronics enclosure 10 also includes a circuit board 20 having a lower surface located adjacent to the upper surface of housing 14. Circuit board 20 includes circuit board alignment features 28 and plated through-holes 22. As shown, the plated through-holes 22 have a cylindrical shape, and extend from the upper surface of circuit board 20 to the lower surface of circuit board 20. The interior surfaces of the plated through-holes 22 are plated with an electrically conducting material 24, such as plated copper. In the present embodiment, circuit board 20 is a multi-layer circuit board made of an FR4 material. In alternate embodiments, circuit board 20 may be made of materials other than FR4, such as, for example, ceramic material. Although in the present embodiment, circuit board alignment features 28 are cylinders extending from the bottom surface of circuit board 20 through circuit board 20 through the upper surface of circuit board 20, in an alternate embodiment, circuit board alignment features 28 may extend from the lower surface of circuit board 20 without extending through to the upper surface of circuit board 20.

As shown, the cylindrically shaped circuit board alignment features 28 are positioned relative to housing alignment features 16, such that the circuit board alignment features 28 slide over the housing alignment features 16. As shown, by aligning housing alignment features 16 to circuit board alignment features 28, the barrier features 18 of housing 14 are aligned with plated through-holes 22 of circuit board 20. The plated through-holes 22 of circuit board 20 are located relative to barrier features 18, such that the barrier features 18 are in contact with circuit board 20 adjacent to and surrounding the plated through-holes 22, such that the plated through-holes 22 are isolated from material that may be in contact with the outside surfaces of barrier features 18. Plated through-holes 22 are also aligned with barrier features 18 by housing alignment features 16 and circuit board alignment features 28, such that the cavities formed on the interior of barrier features 18 aligns with the cavities of plated through-holes 22, and such that the cavities of plated through-holes 22 are in contact with the cavities of barrier features 18.

In the present embodiment, an adhesive 50 is employed to join the lower surface of circuit board 20 to the upper surface of housing 14. In the present embodiment, the adhesive 50 is used to secure the circuit board 20 to the housing 14, and to prevent epoxy overmold material from intruding into areas where it is not desired. The adhesive 50 is typically an acrylic adhesive tape with thermal properties and strength properties to securely locate the printed circuit board prior to the epoxy cure. In alternate embodiments, the adhesive 50 may be a thermal pad with a stamped shape designed for the application or thermal requirements, a tape with adhesive surfaces, or a dispensed liquid adhesive that will form a seal in the areas as required.

Circuit board 20 is also shown including surface mount electronic devices 26 mounted to the upper surface of circuit board 20. Surface mount electronic devices 26 may include active and/or passive components, such as, for example, transistors, inductors, capacitors, diodes, and resistors. In an alternate embodiment, surface mount electronic devices 26 are mounted to both the upper and lower surfaces of circuit board 20. Circuit board 20 also includes various conducting paths (not shown) on exterior and interior surfaces of circuit board 20, which act to electrically couple the various electronic components located on the surface of circuit board 20. Circuit board 20 is also configured, such that the electrically conducting material 24 coating the interior surfaces of plated through-holes 20 is in electrical contact with various layers of the circuit board 20. The various layers of circuit board 20 are electrically coupled to various electronic components, including surface mount electronic devices 26.

Electronics enclosure 10 also includes an epoxy material 40 deposited on various surfaces of housing 14 and circuit board 20. In addition to being deposited on exterior exposed surfaces of electronics enclosure 10, epoxy material 40 is also located in various locations between circuit board 20 and housing 14. However, as shown in FIG. 2, barrier features 18 act as a barrier, such that epoxy material 40 is substantially prevented from being in contact with the electrically conducting material 24 located on the interior surfaces of plated through-holes 22. More specifically, when epoxy material 40 is applied to and/or injected into electronics enclosure 10, barrier features 18, which are in contact with circuit board 20 and surround plated through-holes 22, act to prevent the epoxy material 40 from flowing into the cavity formed by plated through-hole 22, or the cavity formed by the interior surfaces of barrier features 18. In addition, as shown in FIG. 2, the epoxy material 40 is positioned on the upper surface of circuit board 20, such that the epoxy material 40 is substantially isolated from the upper surface of plated through-hole 22, and the electrically conducting material 24 coating plated through-hole 22. As will be discussed later, epoxy material 40 is prevented from entering plated through-hole 22 by features of tooling used during the manufacture of electronics enclosure 10. As shown, cavities extend from the upper surface of epoxy material 40 through plated through-holes 22, and into the interior of barrier features 18.

Electronics enclosure 10 also includes a leadframe assembly 12 located adjacent to the upper surface of epoxy material 40. Leadframe assembly 12 includes multiple lead fingers 32 surrounded by leadframe encapsulant material 30. In the present embodiment, the leadframe encapsulant 30 is made from an electrically non-conducting material such as, for example, polyester, nylon or plastic. The leadframe encapsulant 30 provides structural support for the lead fingers 32, and provides electrical isolation between the lead fingers 32. In the present embodiment, lead fingers 32 that extend through leadframe encapsulant material 30 are bent at approximately right angles relative to the lower surface of leadframe assembly 12. Lead fingers 32 are configured, such that they may slidably enter plated through-holes 22 while remaining in electrical contact with the electrically conducting material 24 of plated through-holes 22. Leadframe assembly 12 is positioned adjacent to the upper surface of epoxy material 40, such that portions of lead fingers 32 extending from the lower surface of leadframe assembly 12 extend through the cavities in epoxy material 40 into plated through-holes 22 and into the cavities formed by barrier features 18. As shown, the lead fingers 32 are in electrical contact with electrically conducting material 24 coating plated through-holes 22. In alternate embodiments, the lead fingers 32 extend into plated through-holes 22, but not into cavities formed by barrier features 18. As noted above, lead fingers 32 are in electrical contact with the electrically conducting material 24 of plated through-holes 22.

The lead fingers 32 of leadframe assembly 12 are connected to electronic devices (not shown) external to electronics enclosure 10, and act to carry signals to electronic components, including surface mount electronic devices 26, of electronics enclosure 10 from other electronic devices coupled to leadframe assembly 12. The lead fingers 32 are also configured to carry electronic signals from devices electrically coupled to leadframe assembly 12 to electronic devices, including surface mount electronic devices 26, located in electronics enclosure 10. As shown, leadframe assembly 12 is positioned adjacent the upper surface of epoxy material 40, such that the overall height of electronics enclosure 10 including leadframe assembly 12 is minimized. As shown, electronics enclosure 10 has a maximum height 82 from the lower surface of housing 14 to the upper surface of the epoxy material 40. In the present embodiment, the height 82 has a maximum value of 12 millimeters. In alternate embodiments, the height 82 has a maximum value of between 12 millimeters and 17.5 millimeters.

Figure 3A:
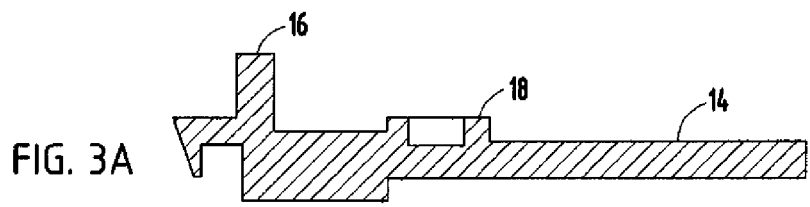
FIG. 3A is a cross-sectional view of a housing provided in a first step of a method for fabricating an electronics enclosure, according to one embodiment of the present invention.
Figure 3B:
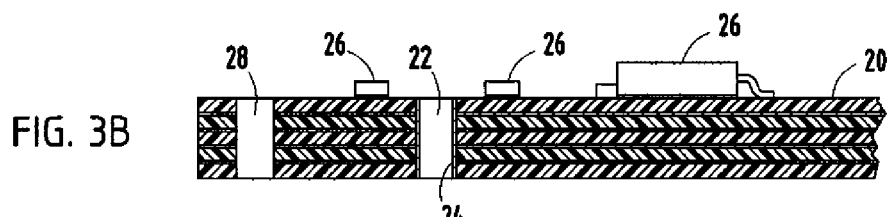
FIG. 3B is a cross-sectional view of a circuit board provided in a second step of the method.
Figure 3C:
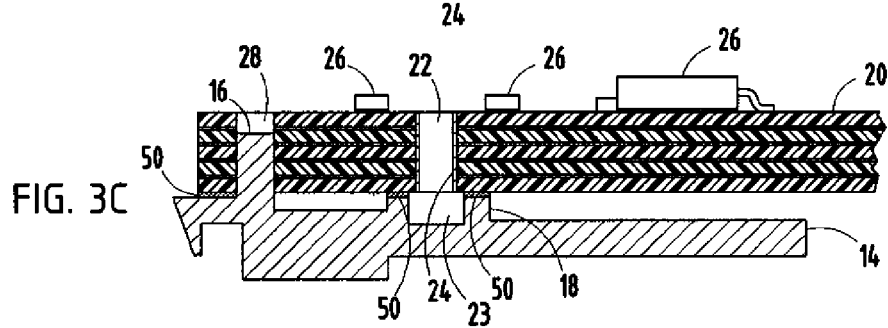
FIG. 3C is a cross-sectional view of the housing of FIG. 3A joined to the circuit board of FIG. 3B, according to a third step of the method.
Figure 3D:
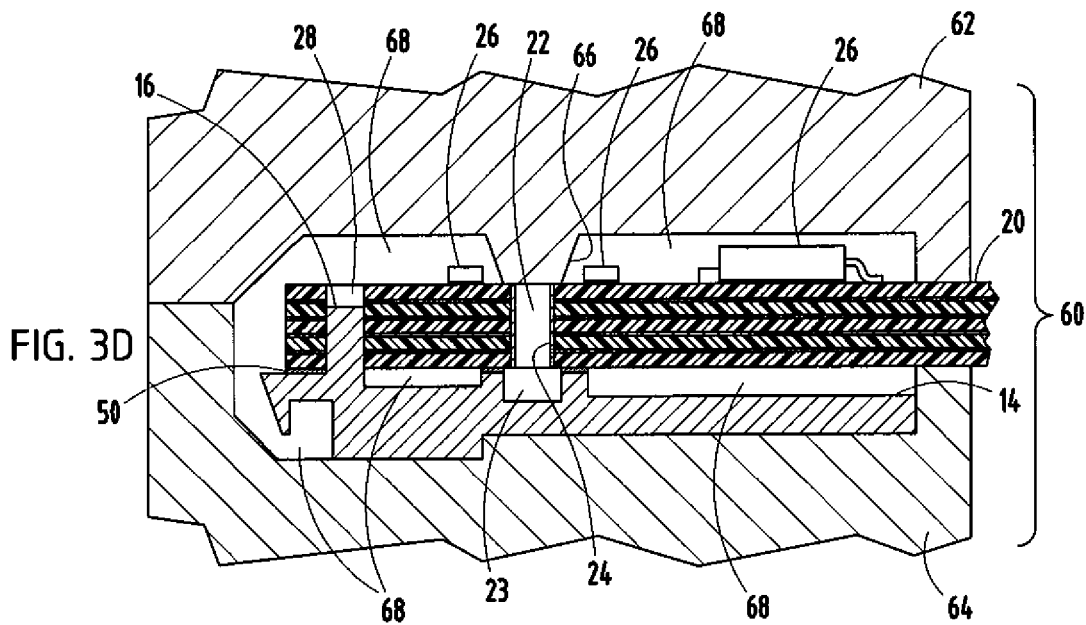
FIG. 3D is a cross-sectional view of tooling positioned around a circuit board and housing in a fourth step of the method.
Figure 3E:
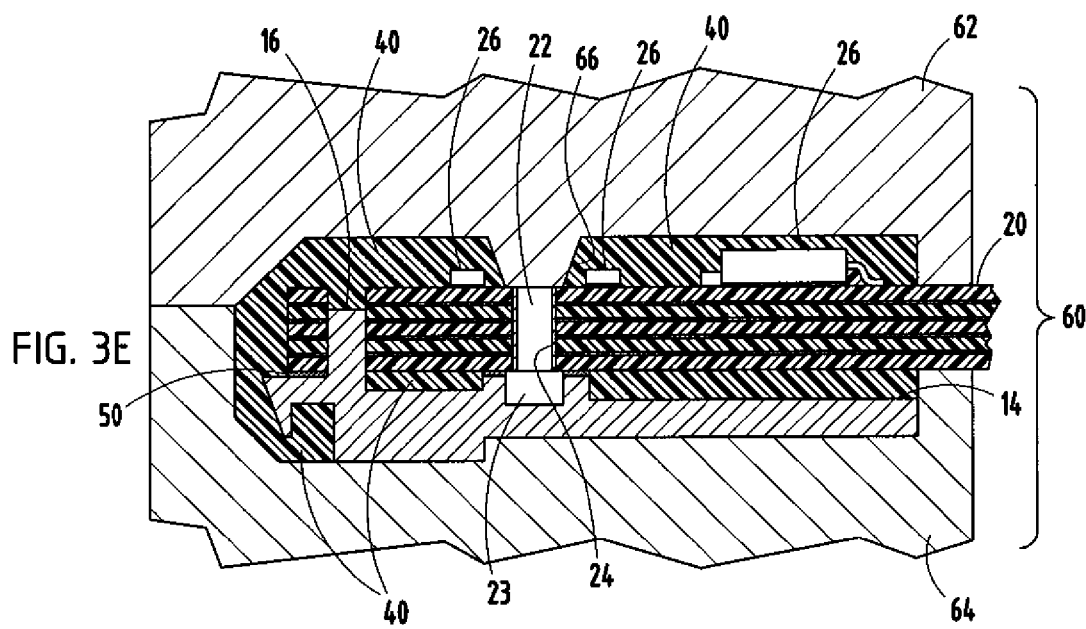
FIG. 3E is a cross-sectional view of an epoxy being applied between tooling, a circuit board, and housing, according to a fifth step of the method.
Figure 3F:
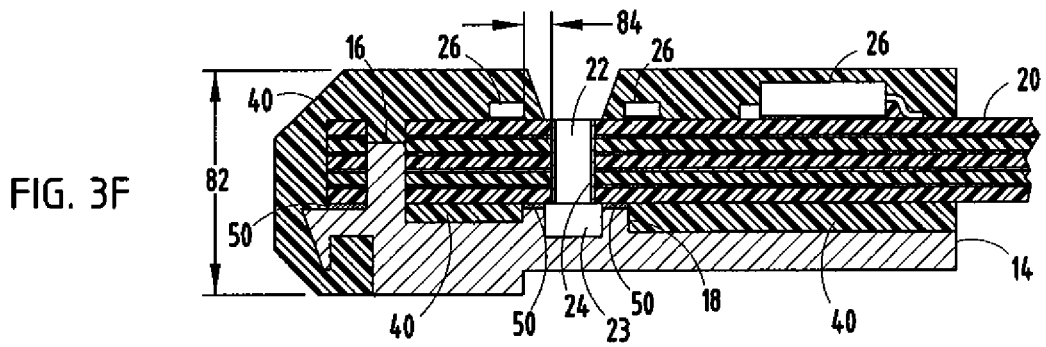
FIG. 3F is a cross-sectional view of the housing and circuit board after the tooling has been removed in a sixth step of the method.
Figure 3G:
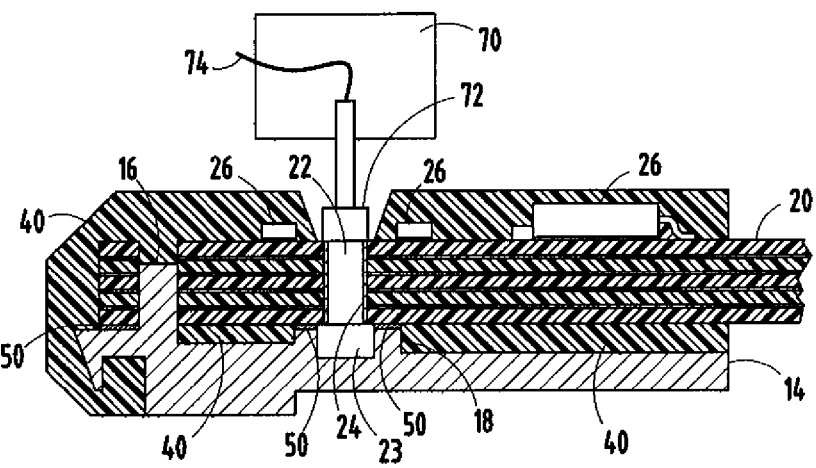
FIG. 3G is a cross-sectional view of a test probe testing circuitry in a seventh step of the method.
Figure 3H:
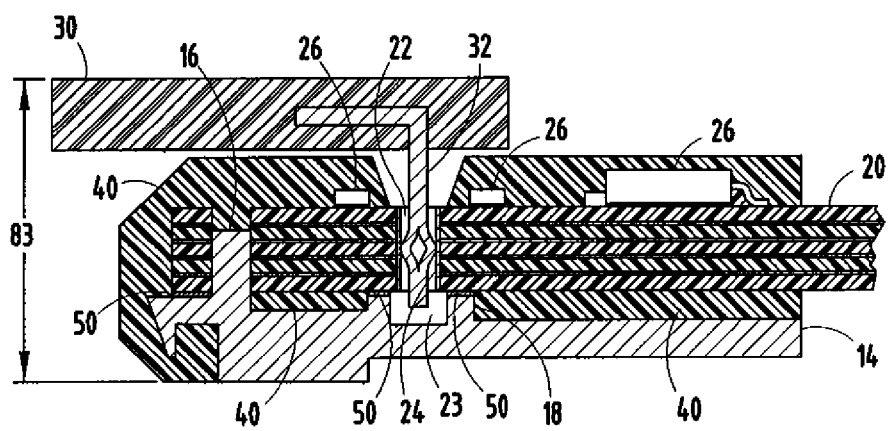
FIG. 3H is a cross-sectional view of a leadframe assembly joined to the assembly of FIG. 3F in an eighth step of the method.

Electronics enclosure 10 is also shown in FIG. 3H having a maximum height 83 between the lower surface of housing 14 and the upper surface of leadframe assembly 12. In the present embodiment, the height 83 has a maximum value of approximately 17.0 millimeters, providing a significant overall packaging improvement and efficient use of available space. In an alternate embodiment, the maximum value of height 83 is less than 39 millimeters.

Electronics enclosure 10 is also shown in FIG. 3F having a distance 84 between at least one surface mount electronic device 26 and the edge of a plated through-hole 22. In the present embodiment, the distance 84 between a surface mount electronic device 26 and the edge of a plated through-hole 22 is 1.5 millimeters. In an alternate embodiment, the distance 84 is less than 10 millimeters.

In an alternate embodiment, a sealant material 80 is deposited into the cavities in the upper surface of epoxy material 40, plated through-hole 22, and barrier feature 18, in order to secure lead fingers 32 within plated through-holes 22, and to provide a moisture barrier to prevent moisture or other contaminants from entering plated through-hole 22.

Referring to FIG. 3A, a housing 14 is provided in a first step of a method for fabricating an electronics enclosure 10, according to one embodiment of the present invention. As shown, the housing 14 includes housing alignment features 16 and barrier features 18. As shown, housing alignment features 16, in the present embodiment, are posts extending upward from an upper surface of the housing 14. Barrier features 18 are features extending upward from the upper surface of housing 14, and enclosing a cavity. In the present embodiment, barrier features 18 are in the form of cylinders. In alternate embodiments, barrier features 18 may have other shapes, such as squares or rectangles. In the present embodiment, housing 14 is die cast, and is made from aluminum.

Referring to FIG. 3B, a circuit board 20 is provided in a second step of the method. As shown, circuit board 20 includes circuit board alignment features 28 and plated through-holes 22. Plated through-holes 22 have an electrically conducting material 24 deposited on the interior surfaces of the plated through-holes 22. As shown, plated through-holes 22 extend from an upper surface of circuit board 20 to a lower surface of circuit board 20, leaving a cavity on the inside of the plated through-holes 22. As shown, circuit board alignment feature 28 is a hole extending from a lower surface of the circuit board 20 to an upper surface of the circuit board 20. In the present embodiment, circuit board alignment feature 28 is cylindrical in shape. Circuit board 20 is also shown having surface mount electronic devices 26 deposited on its upper surface. In alternate embodiments, circuit board 20 may have surface mount electronic devices 26 deposited on its lower surface and/or both its upper and lower surfaces.

Referring to FIG. 3C, the circuit board 20 of FIG. 3B is positioned adjacent to the housing 14 of FIG. 3A in a third step of the method. As shown, circuit board 20 is positioned, such that the housing alignment features 16 of housing 14 are positioned within circuit board alignment features 28 of circuit board 20. In addition, plated through-holes 22 are aligned with barrier features 18, such that the cavities formed by barrier features 18 are in contact with the cavities of plated through-holes 22. In addition, circuit board 20 is positioned, such that barrier features 18 act as barriers to prevent material from entering the cavities of barrier features 18 and plated through-holes 22 when circuit board 20 is positioned adjacent to housing 14. As shown, circuit board 20 is joined to housing 14 by an adhesive 50 positioned between the lower surface of circuit board 20 and the upper surface of housing 14.

In a fourth step of the method generally illustrated in FIG. 3D, tooling 60 is positioned, such that it substantially surrounds the structure formed by circuit board 20 and housing 14 in the previous third step of the method. As shown, tooling 60 includes upper tool element 62 and lower tool element 64. Upper tool element 62 of tooling 60 includes cover features 66. As shown, circuit board 20 and housing 14 are positioned within tooling 60, such that the cover features 66 of upper tool element 62 are aligned with plated through-holes 22, and act as barriers over the top of plated through-holes 22 and electrically conducting material 24, such that material is prevented from entering plated through-holes 22 and contacting electrically conducting material 24. As shown, circuit board 20 and housing 14 are also positioned within tooling 60, such that a number of voids 68 are present between the inner surfaces of tooling 60 and the surfaces of circuit board 20 and housing 14. In addition, as shown, voids 68 are present between the lower surface of circuit board 20 and the upper surface of housing 14.

FIG. 3E generally illustrates a fifth step of the method in which an epoxy material 40 is applied to circuit board 20, housing 14, and tooling 60, such that the epoxy material 40 fills the voids 68. As can be seen in FIG. 3E, because of the location of barrier features 18 and cover feature 66 relative to the plated through-holes 22 and electrically conducting material 24, the epoxy material 40 applied in this fifth step of the method is prevented from entering plated through-holes 22, or the cavities under plated through-holes 22 formed by barrier features 18.

FIG. 3F generally illustrates a sixth step of the method in which the tooling 60 is removed from the structure formed in the fifth step of the method. As shown, the resulting structure includes areas of exposed epoxy material 40, housing 14, and plated through-holes 22. Because of the location of cover feature 66 in the previous step of the method, cavities in the epoxy material 40 are located above the plated through-holes 22, providing access to the plated through-holes 22 in the resulting structure.

FIG. 3G generally illustrates a seventh step of the method in which a tester 70 is used to test circuitry contained in the resulting electronics enclosure 10. As shown, tester 70 includes a test probe 72 and an electrical connector 74. Electrical connector 74 is electrically coupled to circuitry external to tester 70, and is configured to analyze and test the circuitry to which the test probe 72 of tester 70 is electrically coupled. As shown in this step of the method, a test probe 72 is placed in electrical contact with electrically conducting material 24 of at least one plated through-hole 22, such that tester 70 may send test signals to electronic circuitry located in electronics enclosure 10, and receive signals from electronic circuitry located in electronics enclosure 10. Test probe 72 is removed from electrical contact with plated through-hole 22 of electronics enclosure 10 after testing has been completed.

FIG. 3H generally illustrates an eighth step of the method in which lead fingers 32 of a leadframe assembly 12 are inserted into the plated through-holes 22 of the electronics enclosure 10. As shown, in the present embodiment, the lead fingers 32 are supported by encapsulant material 30 that also electrically isolates the lead frame fingers 32 from each other. As shown, the outer surfaces of the lead fingers 32 contact the interior surfaces of the plated through-holes 22 such that the lead fingers 32 are in electrical contact with the electrically conducting material 24 of plated through-holes 22. Lead fingers 32 can be fully or semi-automatically inserted into the plated through-holes 22. In an alternate embodiment, lead fingers 32 are manually inserted into plated through-holes 22. As shown in the present embodiment, the ends or tips of lead fingers 32 extend into the cavities formed by the barrier features 18. As a result of this step of the method, signals provided to leadframe assembly 12 by circuitry coupled to leadframe assembly 12 may be provided to circuitry in electronics enclosure 10 via the lead fingers 32 that are electrically coupled to electrically conducting material 24 of plated through-holes 22. In addition, signals provided by circuitry in electronics enclosure 10 may be provided to devices electrically coupled to leadframe assembly 12 by means of the lead fingers 32, which are electrically coupled to the electrically conducting material 24 of plated through-holes 22.

Figure 3I:
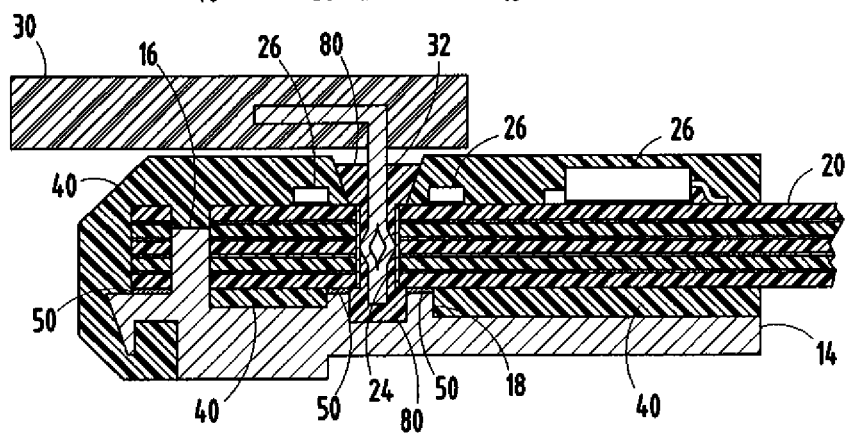
FIG. 3I is a cross-sectional view of the final assembly, including a sealant deposited on the assembly of FIG. 3H, according to a ninth step of the method.

FIG. 3I generally illustrates a ninth step of the method in which a sealant 80 is deposited into the cavities formed by barrier features 18, plated through-holes 22, and the cavities in the upper surface of epoxy material 40. Sealant 80 is flowably applied to the plated through-holes 22 and cavities, such that it substantially fills the cavities surrounding the lead fingers 32, while still allowing lead fingers 32 to electrically contact electrically conducting material 24 of plated through-holes 22. Although in the present embodiment lead fingers 32 are sized such that they are retained in plated through-holes 22, sealant 80 may also act to provide additional means for securing lead fingers 32 within plated through-holes 22. In addition, sealant 80 acts to prevent moisture and/or other contaminants from entering plated through-holes 22, and interfering with the electrical contact between electrically conducting material 24 and lead fingers 32. It should be appreciated that the cross-sectional view in FIG. 3H shows a fully assembled enclosure of FIG. 2 without sealant material 80 having been applied.

In the present embodiment, the epoxy material 40 is a thermoset epoxy material that is injected under pressure and at an elevated temperature such that is surrounds the electronic assembly to package and protect the electronics within. In the present embodiment, sealant 80 is a flowable, temperature-cured epoxy acting to seal the interconnect area from potential contamination. In alternate embodiments, sealant 80 may be a protective passivant, providing protection from fluid intrusion or electrically conductive small particles around or near the interconnect area.

Although in the present embodiment, housing 14 is die cast aluminum, in alternate embodiments, housing 14 may be a custom shaped stamped aluminum backplate or mechanical support for printed circuit board assembly.

The method and device described above advantageously provide for low-profile compact electronics enclosures providing reliable electrical connections between circuitry located within the electronics enclosure and circuitry coupled to the electronics enclosure.

The above description is considered that of the preferred embodiments only. Modifications of the invention will occur to those skilled in the art, and to those who make or use the invention. Therefore, it is understood that the embodiments shown in the drawings and described above are merely for illustrative purposes, and not intended to limit the scope of the invention, which is defined by the following claims, as interpreted according to the principles of patent law, including the doctrine of equivalents.

The invention claimed is:

1. An electronics enclosure, comprising:
a housing comprising an upper housing surface comprising alignment features and barrier features, and a lower housing surface opposite said upper housing surface;
a substantially planar circuit board comprising an upper circuit board surface and a lower circuit board surface opposite said upper circuit board surface and coupled to said upper housing surface, at least one of said surfaces configured to receive surface mount electronic devices, said circuit board further comprising at least one plated through-hole extending through said circuit board from said upper circuit board surface to said lower circuit board surface, said at least one plated through-hole having an interior surface at least partially coated with electrically conducting material, said circuit board further comprising alignment features; and
an epoxy material at least partially coating said upper circuit board surface and said lower circuit board surface, wherein said alignment features of said circuit board are aligned with said alignment features of said upper housing surface, and wherein said barrier features are located adjacent said at least one plated through-hole and separate said epoxy material coating said lower circuit board surface from said at least one plated through-hole such that said epoxy material coating said lower circuit board surface is not in contact with said at least one plated through-hole, and wherein said epoxy material coating said upper circuit board surface is not in contact with the interior surface of said at least one plated through-hole.

2. The electronics enclosure of claim 1, wherein the electronics enclosure has a maximum thickness of between 12 mm and 17 mm measured between said lower housing surface and an upper surface of said epoxy material coating said upper circuit board surface.

3. The electronics enclosure of claim 1, further comprising at least one surface mount electronics device mounted to at least one of said upper circuit board surface and said lower circuit board surface, wherein a distance between said surface mount electronics device and an inner surface of said at least one plated through-hole is less than 10 mm.

4. The electronics enclosure of claim 1, further comprising a leadframe assembly comprising multiple lead fingers, at least one lead finger of said leadframe assembly configured to fit into said at least one plated through-hole, said at least one lead finger slidably positioned within said at least one plated through-hole such that said at least one lead finger of said leadframe assembly is in electrical contact with electrically conducting material coating the interior surface of said at least one plated through-hole.

5. The electronics enclosure of claim 4, further comprising sealant material deposited in said at least one plated through-hole and configured to impede moisture from entering said at least one plated through-hole.

6. The electronics enclosure of claim 1, wherein said housing is a heat-conducting housing comprising metal.

7. The electronics enclosure of claim 6, wherein said housing is die-cast aluminum.

8. The electronics enclosure of claim 1, wherein alignment features of said housing comprise posts extending upward from said upper surface of said housing, and wherein alignment features of said circuit board comprise holes in said circuit board, and wherein aligned alignment features comprise posts of said housing extending into holes of said circuit board.

* * * * *